(12) United States Patent
Ohkubo (10) Patent No.: US 8,009,272 B2
(45) Date of Patent: Aug. 30, 2011

(54) METHOD AND DEVICE FOR IMAGE MEASUREMENT, EXPOSURE APPARATUS, SUBSTRATE FOR IMAGE MEASUREMENT, AND DEVICE MANUFACTURING METHOD

(75) Inventor: Akinori Ohkubo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 572 days.

(21) Appl. No.: 12/118,959

(22) Filed: May 12, 2008

(65) Prior Publication Data

US 2008/0291420 A1 Nov. 27, 2008

(30) Foreign Application Priority Data

May 22, 2007 (JP) ................................. 2007-134943

(51) Int. Cl.
*G03B 27/42* (2006.01)
(52) U.S. Cl. ........................................... 355/53; 355/72
(58) Field of Classification Search .................... 355/30, 355/53, 72
See application file for complete search history.

(56) References Cited

U.S. PATENT DOCUMENTS

| 6,151,102 A | * | 11/2000 | Nishi | ................................. 355/53 |
| 2006/0132775 A1 | * | 6/2006 | Sengers et al. | ................. 356/401 |
| 2007/0153251 A1 | * | 7/2007 | Ogusu | ............................ 355/67 |

OTHER PUBLICATIONS

W. N. Partlo, C. H. Fields and W. G. Oldham, "Direct aerial image measurement as a method of testing high numerical aperture microlihographic lenses", J. Vac. Sci. Technol. B, vol. 11, pp. 2686-2691.

* cited by examiner

*Primary Examiner* — Edward J Glick
*Assistant Examiner* — Mesfin T Asfaw
(74) *Attorney, Agent, or Firm* — Canon USA, Inc. IP Division (57) ABSTRACT

An image measurement method is provided for measuring an image of a pattern of a mask projected with a projection optical system. The method includes the steps of detecting light transmitted through an aperture while a substrate is arranged at an image plane of the projection optical system, the substrate having a slit and the aperture having a width larger than a width of the slit; adjusting an alignment angle of the slit on the basis of a signal related to the light detected in the detecting; and measuring the image by detecting light transmitted through the slit while moving the slit, the alignment angle of which has been adjusted in the adjusting, in the image plane of the projection optical system.

11 Claims, 8 Drawing Sheets

METHOD AND DEVICE FOR IMAGE MEASUREMENT, EXPOSURE APPARATUS, SUBSTRATE FOR IMAGE MEASUREMENT, AND DEVICE MANUFACTURING METHOD

BACKGROUND OF THE INVENTION

1. Field of the Invention

The present invention relates to an image measurement method, an image measurement device, an exposure apparatus, a substrate for image measurement, and a device manufacturing method.

2. Description of the Related Art

In order to evaluate the performance of a projection optical system of an exposure apparatus while the projection optical system is mounted on the main body of the exposure apparatus, a wafer coated with resist is generally used, and the wafer is exposed to a mask pattern. In this evaluation method, after the exposure, the resist is developed to form a resist pattern, and the resist pattern is measured with, for example, a scanning electron microscope (SEM). The evaluation method needs steps of resist application, development, and measurement, and hence, a single evaluation may take a long time, and need a large cost.

Therefore, a measurement method has been performed in which an image of a mask pattern or a measurement pattern is formed in the air at a position corresponding to a wafer surface, and the light intensity distribution of the formed image is directly measured with a measurement instrument, without the actual exposure (hereinafter, referred to as an aerial image measurement method). An example of this method may be a slit-scan method in which a slit having a width smaller than a wavelength of light from a light source is scanned, and light transmitted through the slit is measured with a photodetector, to measure the light intensity distribution having the size smaller than the wavelength of the light from the light source (refer to W. N. Partlo, C. H. Fields and W. G. Oldham, "Direct aerial image measurement as a method of testing high numerical aperture microlithographic lenses", J. Vac. Sci. Technol. B, Vol. 11, pp. 2686-2691).

Figure 10:
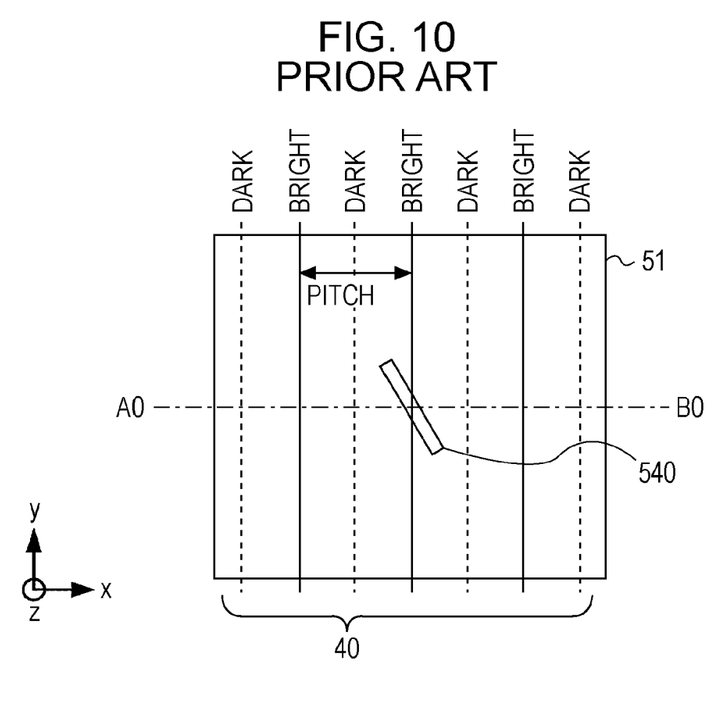
FIG. 10 is a top view of a slit of a related art.
Figure 11:
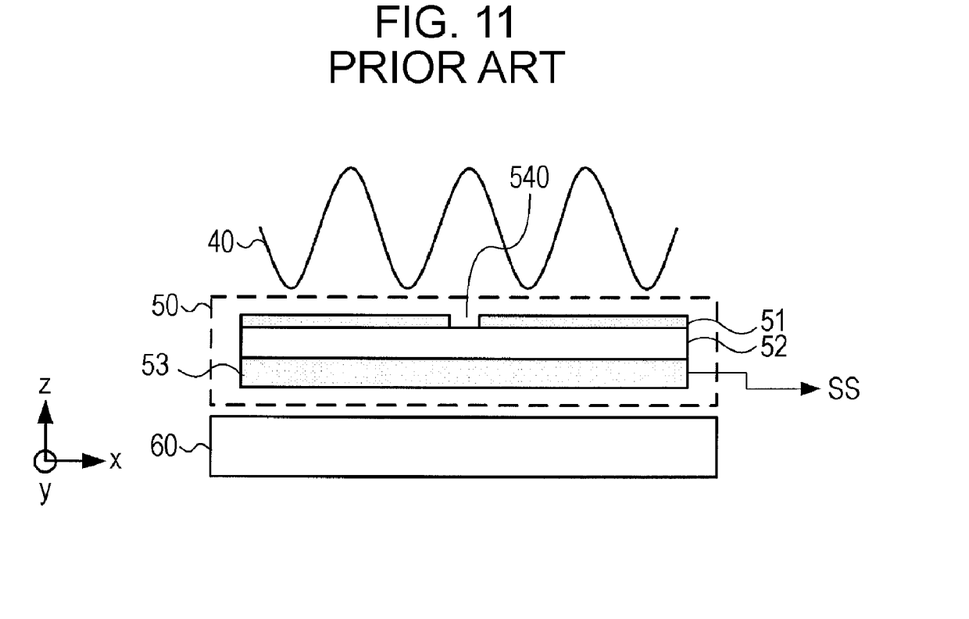
FIG. 11 is a cross section of a sensor of the related art.

The slit-scan method uses, for example, a slit 540 which is formed at a light-shielding film 51 as shown in FIG. 10. FIG. 11 shows a schematic cross section of a measurement device using the slit-scan method, taken along line A0-B0 in FIG. 10. A line/space (hereinafter, referred to as L/S) pattern is illuminated, and its image is formed as to form an aerial image 40 having a periodic intensity distribution. A part of light of the formed aerial image 40 is transmitted through the slit 540. The light transmitted through the slit 540 is transmitted through a transparent substrate 52 which supports the light-shielding film 51, and then is emitted on a photodetector 53. The light emitted on the photodetector 53 is photoelectrically converted, and is output as a slit signal SS. A sensor 50, which includes the light-shielding film 51, the transparent substrate 52, and the photodetector 53, is scanned by a stage 60 in the x direction. A slit signal SS is monitored every scanning step. The signal obtained by slit-scanning and monitoring (hereinafter, referred to as a slit-scan signal) is used to measure the aerial image 40. The slit-scan signal is a signal in which a slit signal SS is modulated depending on a scanned position of the sensor 50.

Figure 12:
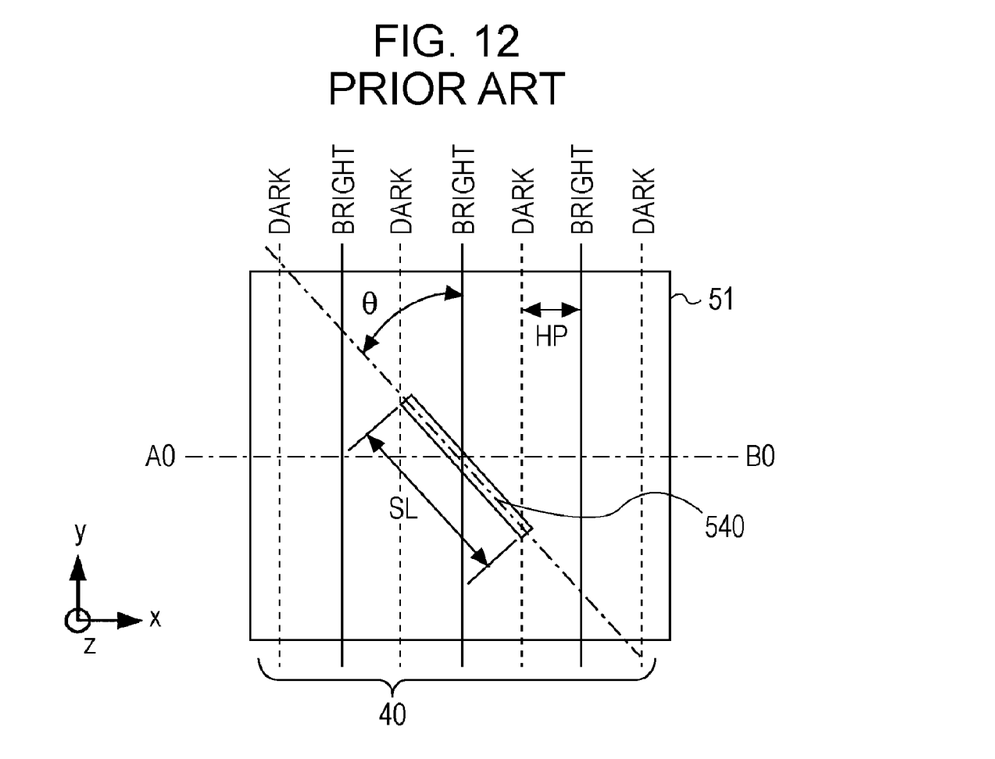
FIG. 12 is an explanatory view of a positional error of the slit of the related art.

Unfortunately, with the above slit-scan method, when the pitch of variation in the intensity distribution of the aerial image 40 becomes short, the modulation factor of the slit-scan signal may be significantly degraded if the longitudinal direction of the slit 540 is shifted from a line-extending direction of the L/S pattern in the aerial image 40. The modulation factor is expressed by (maximum value-minimum value)/(maximum value) of the light intensity. FIG. 12 shows the longitudinal direction of the slit 540, and the direction in which the aerial image of the L/S pattern is formed. The aerial image 40 is an image of the L/S pattern formed in parallel to the y direction. The light intensity distribution is modulated by a half pitch HP in the x direction. The longitudinal direction of the slit 540 formed at the light-shielding film 51 is shifted with respect to the direction (y direction) parallel to the L/S pattern of the aerial image 40, by an angle θ in a rotation direction in the x-y plane. Ideally, if θ is substantially zero, a slit-scan signal of a high modulation factor can be obtained. However, in fact, θ is not zero due to an alignment error or the like.

When the slit 540 is scanned in the x direction in this state, the modulation factor of the slit-scan signal may be degraded more than the modulation factor of the aerial image 40. Further, if the position of the slit 540 is shifted such that the slit 540 extends over the pitches of the L/S pattern of the aerial image 40, the light quantity of light emitted on the slit 540 would not be changed although the slit 540 is scanned. The modulation factor of the slit-scan signal becomes substantially zero, and hence, the measurement is no longer available. Assuming that an angle defined by the slit 540 and the L/S pattern is θc, the angle θc can be expressed as follows:

$$\theta c = \arcsin(2HP/SL)$$

where SL is a length of a slit in the longitudinal direction, and HP is a half pitch of the variation in light intensity distribution of the aerial image 40. If the angle defined between the slit 540 and the L/S pattern is smaller than θc, the light quantity of light emitted on the slit 540 is modulated by slit-scanning.

Figure 13:
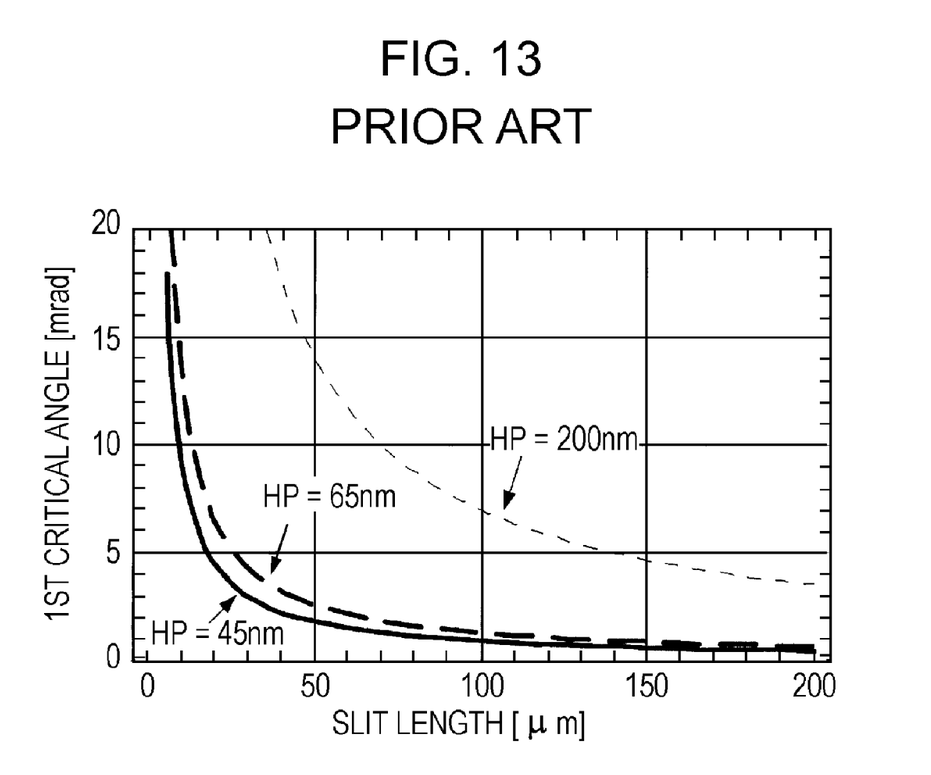
FIG. 13 is an explanatory view of the positional error of the slit and a detected light quantity of the related art.

FIG. 13 plots the function according to HP and SL. The vertical axis represents θc. As shown in FIG. 13, in a case where the slit length SL is about 50 μm, θc is about 14 mrad when HP is 200 nm. In contrast, when HP is 45 nm, θc becomes markedly small as about 2 mrad. That is, as HP decreases, θc decreases. To obtain a slit-scan signal with a high modulation factor having a small tolerance of the position shift, a high alignment accuracy allowing the position-shift angle θ to be at least smaller than θc is required.

In other words, when the light intensity distribution of light with a spatial variation pitch smaller than a wavelength of light from a light source is measured by the slit-scan method, if the longitudinal direction of a slit is shifted from a direction in which an one-dimensional-space light-intensity distribution does not vary, the modulation factor of the signal to be measured may be degraded.

SUMMARY OF THE INVENTION

Accordingly, the present invention provides an aerial image measurement method and an aerial image measurement device capable of measuring an aerial image immediately and highly accurately.

According to an aspect of the invention, an image measurement method is provided for measuring an image of a pattern of a mask projected with a projection optical system. The method includes the steps of detecting light transmitted through an aperture while a substrate is arranged at an image plane of the projection optical system, the substrate having a slit and the aperture having a width larger than a width of the slit; adjusting an alignment angle of the slit on the basis of a signal related to the light detected in the detecting; and measuring the image by detecting light transmitted through the slit while moving the slit, the alignment angle of which has been adjusted in the adjusting, in the image plane of the projection optical system.

According to another aspect of the invention, an image measurement device is configured to measure an image of a pattern of a mask projected with a projection optical system. The device includes a detection unit configured to detect light transmitted through an aperture while a substrate is arranged at an image plane of the projection optical system, the substrate having a slit and the aperture having a width larger than a width of the slit; a signal processing unit configured to process a signal related to the light detected by the detection unit; and an alignment unit configured to adjust an alignment angle of the slit on the basis of the signal processed with the signal processing unit. The image is measured by detecting light transmitted through the slit while moving the slit, the alignment angle of which has been adjusted by the alignment unit, in the image plane of the projection optical system.

Other embodiments, features and aspects of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Various embodiments, features and aspects of the present invention will now herein be described in detail in accordance with the accompanying drawings.

Figure 1:
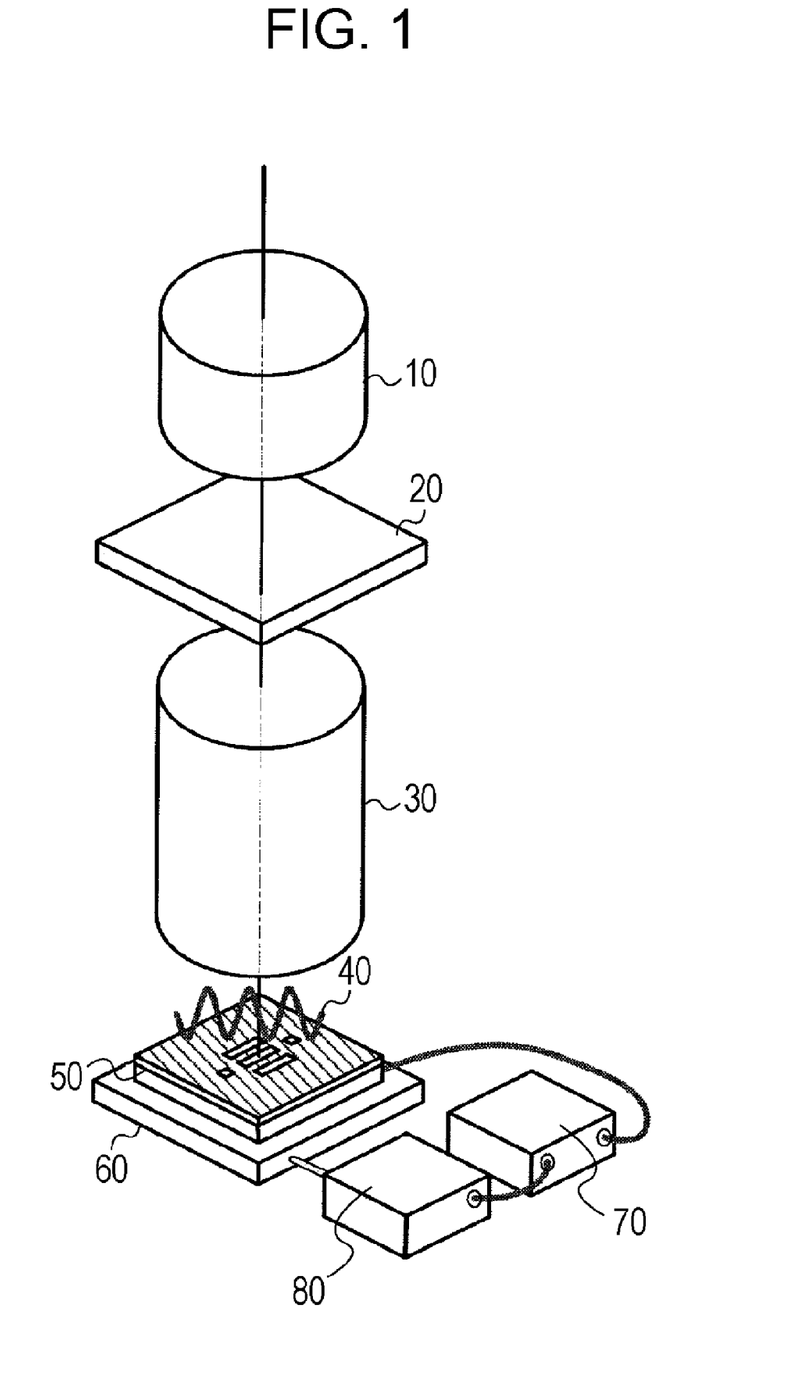
FIG. 1 is an explanatory view schematically showing a state in which an aerial image measurement is performed in an exposure apparatus.

FIG. 1 is an explanatory view schematically showing a state of measuring an optical performance of a projection optical system in an exposure apparatus according to an embodiment of the invention. In the drawing, reference numeral 20 denotes a mask, 10 denotes an illumination optical system to illuminate the mask 20 with light from a light source (not shown), 30 denotes a projection optical system, and 40 denotes an aerial image. Reference numeral 50 denotes a sensor, 60 denotes a stage to drive the sensor 50, 70 denotes a signal processing unit to process a signal from the sensor 50, 80 denotes a drive unit (alignment unit) to drive the stage 60 in accordance with a signal output from the signal processing unit 70.

The illumination optical system 10 shapes light from the light source, and emits the shaped light on the mask 20. The mask 20 has a pattern formed using a light-shielding film made of, for example, chromium. By emitting the light on the mask 20 having the pattern, transmitted light and diffracted light are generated depending on the pattern. The transmitted light and diffracted light thus generated are emitted on the projection optical system 30. The projection optical system 30 allows an image of the pattern of the mask 20 to be formed at an image plane. At the image plane, an aerial image 40 is thus formed. The aerial image 40 contains effects of the light source, the illumination optical system 10, the pattern of the mask 20, the projection optical system 30, mechanisms holding these components, the installation environment of the exposure apparatus, and the like.

As shown in FIG. 11, the sensor 50, serving as a detection unit, includes a light-shielding film 51, a transparent substrate 52, and a photodetector 53.

Figure 2:
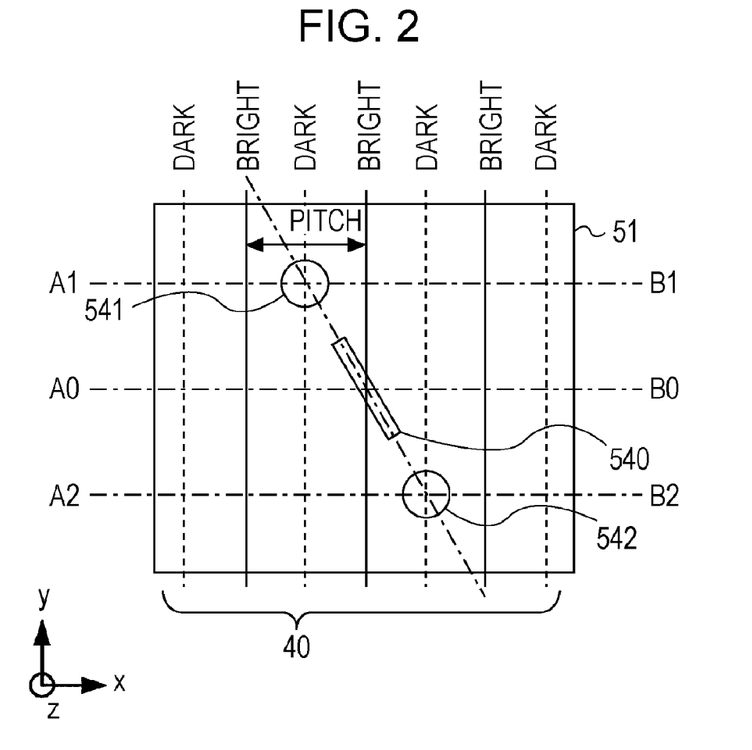
FIG. 2 is a top view of a sensor in FIG. 1.

FIG. 2 is a top view of the sensor 50. The light-shielding film 51 of the sensor 50 has a slit 540 having a width corresponding to a resolution of the measurement (i.e., a length along a short side), and alignment apertures 541 and 542. The "width corresponding to a resolution of the measurement" is a width substantially equivalent to or smaller than a minimum pitch of a variation in intensity distribution of the aerial image 40.

In the sensor 50, the photodetector 53 receives the light transmitted through the slit 540 and the alignment aperture 541, photoelectrically converts the light into signals, and outputs the signals to the signal processing unit 70. The signal processing unit 70 processes the signal from the slit 540 and the signal from the alignment aperture 541, the signals being output from the sensor 50, and outputs a driving signal to the drive unit 80. The drive unit 80 outputs a signal to drive the stage 60, on the basis of the output signal from the signal processing unit 70.

Figure 3:
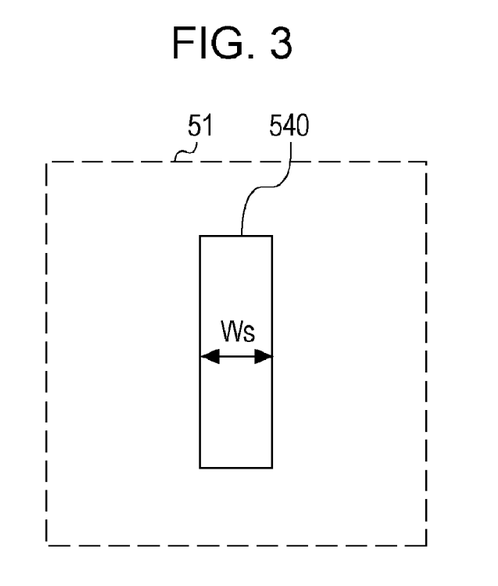
FIG. 3 is a top view of a slit in FIG. 2.

FIG. 3 is an enlarged view of the slit 540. It is assumed that the width along the short side of the slit 540 (in a scanning direction) is Ws. In order to perform the highly accurate aerial image measurement for obtaining a resolution corresponding the size smaller than the wavelength, Ws should be determined as follows:

$$Ws \leq \lambda$$

where $\lambda$ is a wavelength of light from the light source.

Figure 4:
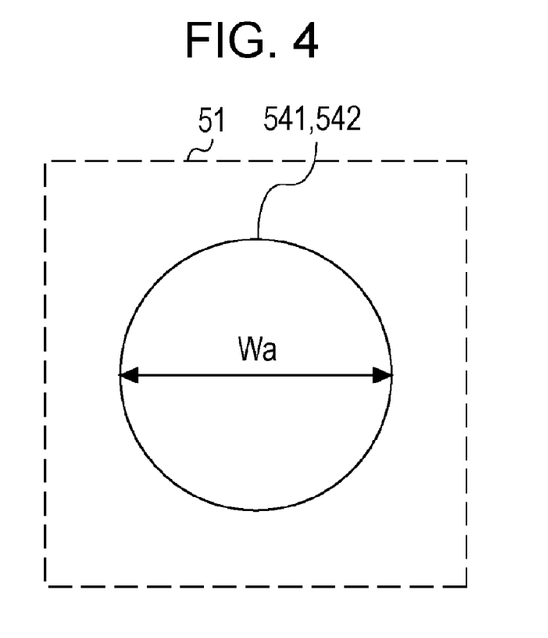
FIG. 4 is a top view of an alignment aperture in FIG. 2.

In addition, if the alignment apertures 541 and 542 in FIG. 2 are circular apertures, the width Wa of each aperture in the scanning direction of the slit 540 as shown in FIG. 4 is expressed as follows:

$$Wa \geq 10 \times \lambda$$

Figure 5:
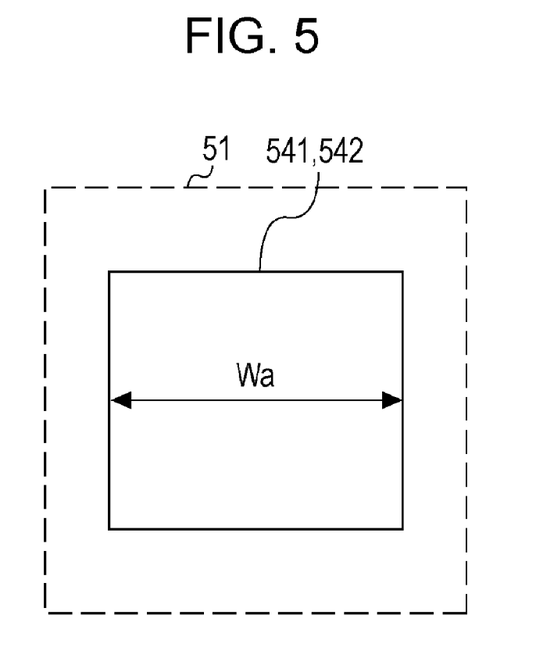
FIG. 5 is a top view of another example of the alignment aperture.

Since the size of each aperture is larger than the wavelength, the light transmitted through the alignment aperture can be measured without interfering with the light transmitted through the slit. The slit-transmitted light can be accurately measured. If the aperture is rectangular, the angle of divergence of the transmitted light thereof is smaller than that in a case of the circular aperture. Hence, similarly to the circular aperture, Wa shown in FIG. 5 should be expressed as follows:

$$Wa \geq 10 \times \lambda$$

If the expression is satisfied, the slit-transmitted light can be measured without interfering with the alignment-aperture-transmitted light.

Also, since the alignment aperture is larger than the slit, the quantity of transmitted light is larger. The illuminance of the alignment-aperture-transmitted light on the photodetector is higher than that of the slit-transmitted light. The difference between the illuminance of the alignment-aperture-transmitted light and that of the slit-transmitted light can be decreased by providing a light-reducing film on the alignment aperture, so that the transmittance at the alignment aperture becomes lower than the transmittance at the slit. Accordingly, the highly accurate measurement with an effective dynamic range of the photodetector can be performed.

Figure 6:
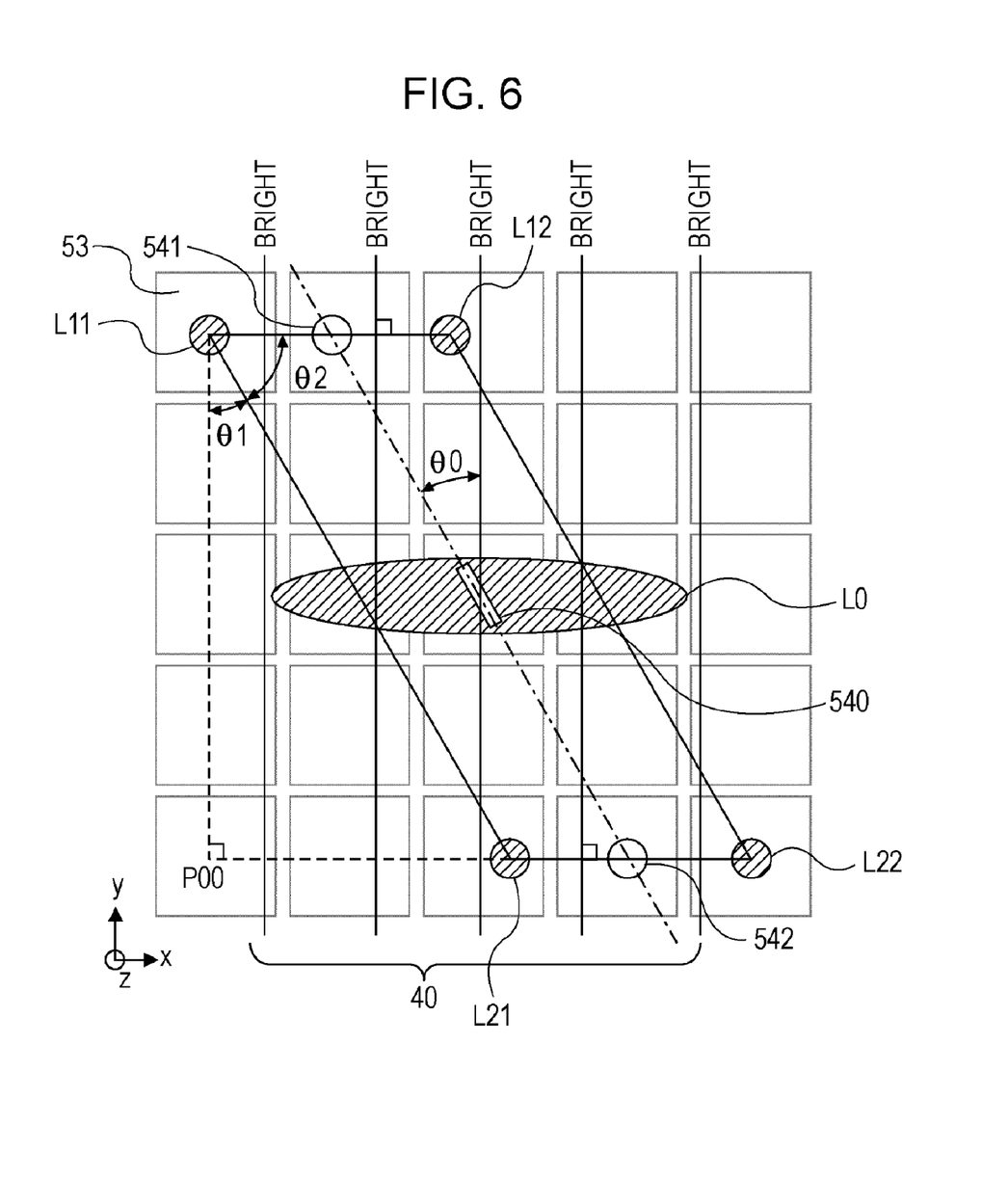
FIG. 6 is an explanatory view showing aspects of an alignment method.

Now, alignment for the measurement method according to this embodiment is described. FIG. 6 is a top view schematically showing how the photodetector 53 detects the transmitted light through the slit 540 and the transmitted light through the alignment apertures 541 and 542, on the photodetection surface. Herein, an example case is considered in which an aerial image 40 is formed by two-beam interference. The photodetector 53 is, for example, divided into the form of two-dimensional photodetector array.

Figure 7:
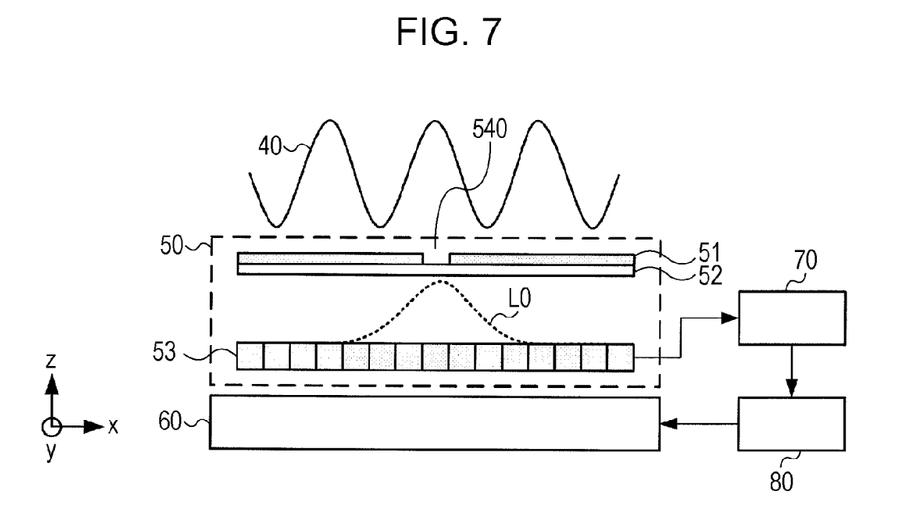
FIG. 7 is a cross section showing a position of the slit of the sensor.

The light transmitted through the slit 540 is distributed as a slit-transmitted light distribution L0 on the photodetector 53, the distribution L0 which is expanded along the short side of the slit 540 as a result of diffraction. The transmitted light causing this distribution is assumed as first transmitted light. FIG. 7 is a cross section taken along line x-z in the top view of FIG. 6, at a position of the slit 540. The first transmitted light is expanded on the photodetector 53 because it is transmitted through the slit 540 with the size smaller than the wavelength. The area of the photodetector with the first transmitted light emitted is referred to as a first photodetection portion.

Figure 8:
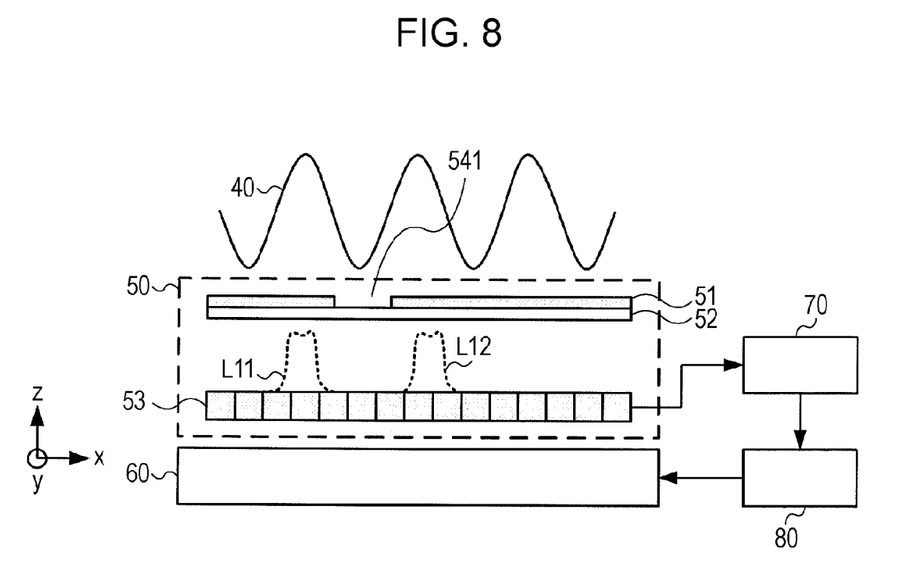
FIG. 8 is a cross section showing a position of the alignment aperture of the sensor.

The light transmitted through the alignment apertures 541 and 542 has the size larger than the wavelength. Hence, the light is not substantially affected by diffraction. The light forms alignment-aperture-transmitted light distributions L11, L12, L21, and L22 on the photodetector 53. The transmitted light causing these distributions is assumed as second transmitted light. The transmitted light distributions L11, L12, L21, and L22 are based on transmitted light with two plane waves. FIG. 8 is a cross section taken along line x-z in the top view of FIG. 6, at a position of the alignment aperture 541. Since the size of the alignment aperture 541 is sufficiently larger than the wavelength, the transmitted light distributions L11 and L12 corresponding to the forward direction of the plane waves, which form the aerial image 40, are formed on the photodetector 53. These areas of the photodetector 53 with the second transmitted light emitted are referred to as second photodetection portions.

The signal from the first photodetection portion and the signals from the second photodetection portions are output to the signal processing unit 70. The signal processing unit 70 calculates the position of L11 as P11, the position of L12 as P12, the position of L21 as P21, and the position of L22 as P22. In the method of this embodiment, a segment P11P12 connecting P11 and P12 is orthogonal to the line of the bright-dark intensity distribution of the aerial image 40. Similarly, a segment P21P22 is orthogonal to the line of the bright-dark intensity distribution of the aerial image 40. In order to arrange the line direction of the aerial image 40 to be parallel to the longitudinal direction of the slit 540, the position of the slit 540 may be aligned so that an interior angle of a quadrangle defined by connecting P11, P12, P22, and P21 is changed to the right angle, that is, the quadrangle is changed to a rectangle. If an angle $\theta 2$ ($\angle$P12P11P21) of the interior angles of the quadrangle P11P12P22P21 is an acute angle, it can be immediately calculated that the alignment direction of an axis $\theta z$ (in the rotation direction in the x-y plane) of the slit 540 is a clockwise direction. Referring to FIG. 6, since the angle $\theta 0$ and the angle $\theta 1$ defined by the slit 540 and the line are the same, the alignment amount is $\theta 1$. For example, if $\theta 1$ is an acute angle, the alignment amount $\theta 1$ can be obtained by $\theta 1=90°-\theta 2$. Otherwise, $\theta 1$ can be easily calculated by using an intersection P00 at which a first line containing a segment P21P22 intersects with a second line extending from P11 perpendicularly to the first line. In this case, two segments of a segment P11P00, a segment P11P21, and a segment P21P00 are used for a calculation of an inverse trigonometric function, thereby immediately obtaining $\theta 1$ corresponding to the alignment amount.

By performing the above-mentioned processing with the signal processing unit 70, either or both the alignment direction and the alignment amount of the position of the slit to be aligned with respect to the alignment unit can be obtained. The slit can be aligned with the aerial image immediately and highly accurately. As a result, a slit-scan signal with a high modulation factor can be obtained, and the aerial image can be highly accurately measured.

In this embodiment, the plurality of alignment apertures 541 and 542 are arranged along the longitudinal direction of the slit 540. However, even when the alignment aperture is not arranged along the slit 540, a similar alignment method can be used if relative positions of the slit and the alignment aperture are stored. That is, with the present invention, the slit and the alignment aperture can be arranged desirably if the relative positions of the slit and the alignment aperture are previously determined.

Also, the slit 540 and the alignment apertures 541 and 542 as shown in FIG. 2 may be formed at the same substrate by using an electron beam drawing device with a highly accurate stage. Accordingly, the relative positions of the slit and the alignment aperture can be determined according to the accuracy of the stage. Further, since the slit and the alignment aperture are formed at the same substrate, the relative positions of the slit and the alignment aperture would not be changed over time. Accordingly, the relative positions of the slit and the alignment aperture can be accurately obtained. The alignment accuracy of the measurement method of the invention can be improved. Therefore, the highly accurate aerial image measurement method with a less change over time and with reproducibility can be provided.

The photodetector 53 of the sensor 50 in FIG. 6 may be a photodetector in the form of two-dimensional array (two-dimensional photodetector array) such as a charge-coupled device (CCD) or complementary mental-oxide semiconductor (COMS) device. In such a case, the first and second photodetection portions are formed on the two-dimensional photodetector array. Hence, image processing such as detection of the median point is applied to the positions P11, P12, P21, and P22 of the transmitted light distributions L11, L12, L21, and L22 of the transmitted light through the alignment apertures 541 and 542 in FIG. 6 to accurately obtain the positions. The alignment amount can be accurately calculated. The photodetector 53 can also detect the slit-transmitted light distribution L0. Thus, the cost of the apparatus can be decreased. As a result, the highly accurate, low-cost aerial image measurement method can be provided.

Figure 9:
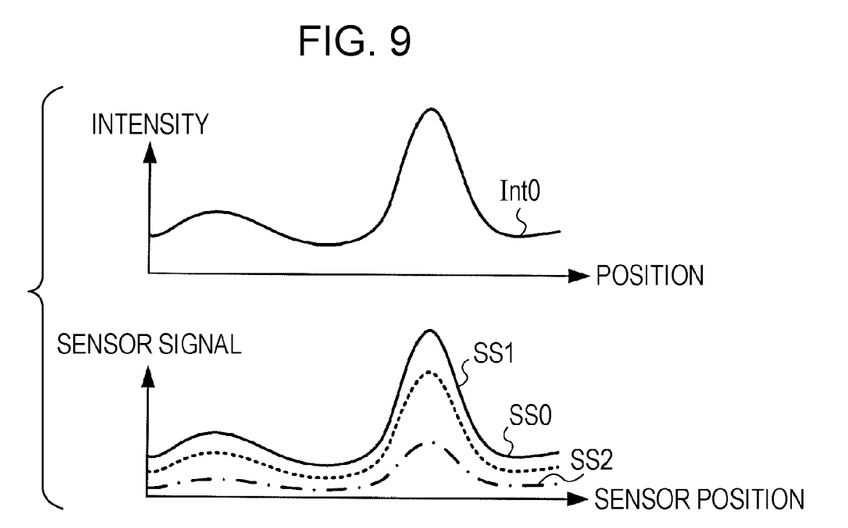
FIG. 9 is a schematic illustration showing slit-scan signals of an aerial image.

FIG. 9 is a schematic illustration showing a generalized slit-scan signal. When the cross section of the intensity distribution of the aerial image in the form of line produced by the projection optical system is Int0, if the slit and the aerial image are not aligned, the slit-scan signal to be output may be a signal SS2 having a markedly degraded modulation factor in comparison with the original aerial image. To avoid this, the measurement method of this embodiment is used, to align the aerial image and the slit. Thus, the signal SS0 having a high modulation factor can be obtained. However, the slit-scan signal to be detected is a signal of light transmitted through the slit formed at the light-shielding film having a limited thickness. The signal becomes a signal in which the transmission characteristic of the slit is convoluted into the intensity distribution of the actual aerial image. The signal may refer a previously stored transmission characteristic of the slit, or the transmission characteristic of the slit can be calculated with a computer to perform recovery processing such as deconvolution, and thereby a signal SS1 approximate to the actual aerial image can be measured. With the above method, the highly accurate aerial image measurement method without depending on the slit shape can be provided.

Since an aerial image measurement device of this embodiment can perform the immediate and highly accurate aerial image measurement method, the projection optical system can be highly accurately evaluated by mounting the aerial image measurement device on a wafer stage of an exposure apparatus. The manufacturing cost of the exposure apparatus can be decreased, and the accuracy of the image formation performance can be increased. Alternatively, the aerial image measurement device does not have to be mounted on the wafer stage, and may be mounted at a position which is located in the exposure apparatus, but different from the wafer stage. Still alternatively, the aerial image measurement device does not have to be mounted in the exposure apparatus. The aerial image measurement device may be mounted at a position corresponding to a wafer surface only during measurement, and the device may be removed after the measurement.

Next, an embodiment of a device (for example, a semiconductor integrated circuit element or a liquid crystal display element) manufacturing method using the above-mentioned exposure apparatus is described. Using the above-mentioned exposure apparatus, a device is manufactured by exposing a substrate (for example, wafer or glass substrate) on which a photoresist is applied, developing the substrate (photoresist), and performing typical subsequent steps. With the device manufacturing method of this embodiment, a high-quality device can be manufactured as comparison with the method in the past.

The entire disclosure of Japanese Patent Application No. 2007-134943 filed on May 22, 2007 including claims, specification, drawings, and abstract incorporated herein by reference in its entirety.

As many apparently widely different embodiments of the present invention can be made without departing from the sprit and scope thereof, it is to be understood that the invention is not limited to the specific embodiments thereof except as defined in the claims.

What is claimed is:

1. An image measurement method for measuring an image of a pattern of a mask projected with a projection optical system, the method comprising:
   detecting light transmitted through an aperture while a substrate is arranged at an image plane of the projection optical system, the substrate having a slit and the aperture;
   adjusting an alignment angle of the slit on the basis of a signal related to the light detected in the detecting; and
   measuring the image by detecting light transmitted through the slit while moving the slit, the alignment angle of which has been adjusted in the adjusting, in the image plane of the projection optical system,
   wherein the width of the slit is smaller than a wavelength of light for illumination of the mask,
   wherein the width of the aperture is larger than the wavelength of the light for the illumination of the mask, and
   wherein the light transmitted through the aperture and the light transmitted through the slit are detected by a photodetector array.

2. The image measurement method according to claim 1, wherein the photodetector array is a two-dimensional photodetector array with a first photodetection portion and a second photodetection portion formed on a light-receiving plane of the two-dimensional photodetector array,
   wherein the first photodetection portion detects the light transmitted through the slit, and
   wherein the second photodetection portion, which is different from the first photodetection portion, detects the light transmitted through the aperture.

3. The image measurement method according to claim 1, wherein a light-reducing film is formed on the aperture, so that the transmittance at the aperture becomes lower than the transmittance at the slit.

4. The image measurement method according to claim 1, wherein the signal related to the light transmitted through the slit is processed by using a transmission characteristic of the slit in the measuring.

5. An image measurement device configured to measure an image of a pattern of a mask projected with a projection optical system, the device comprising:
   a detection unit configured to detect light transmitted through an aperture while a substrate is arranged at an image plane of the projection optical system, the substrate having a slit and the aperture;
   a signal processing unit configured to process a signal related to the light detected by the detection unit; and
   an alignment unit configured to adjust an alignment angle of the slit on the basis of the signal processed with the signal processing unit,
   wherein the image is measured by detecting light transmitted through the slit while moving the slit, the alignment angle of which has been adjusted by the alignment unit, in the image plane of the projection optical system,
   wherein the width of the slit is smaller than a wavelength of light for illumination of the mask,
   wherein the width of the aperture is larger than the wavelength of the light for the illumination of the mask, and
   wherein the detection unit includes a photo detector array, and the light transmitted through the aperture and the light transmitted through the slit are detected by a photodetector array.

6. The image measurement device according to claim 5, wherein the photodetector array is a two-dimensional photodetector array with a first photodetection portion and a second photodetection portion formed on a light-receiving plane of the two-dimensional photodetector array,
   wherein the first photodetection portion as the photodetector detects the light transmitted through the slit, and
   wherein the second photodetection portion, which is different from the first photodetection portion, detects the light transmitted through the aperture.

7. An exposure apparatus configured to expose a substrate to light, the apparatus comprising:
   an illumination optical system configured to illuminate a mask with light from a light source;
   a projection optical system configured to project an image of a pattern of the mask on the substrate; and
   an image measurement device configured to measure the image of the pattern of the mask projected with the projection optical system, the device including, a detection unit configured to detect light transmitted through an aperture while the substrate is arranged at an image plane of the projection optical system, the substrate having a slit and the aperture;

a signal processing unit configured to process a signal related to the light detected by the detection unit; and an alignment unit configured to adjust an alignment angle of the slit on the basis of the signal processed with the signal processing unit, wherein the image is measured by detecting light transmitted through the slit while moving the slit, the alignment angle of which has been adjusted by the alignment unit, in the image plane of the projection optical system, wherein the width of the slit is smaller than a wavelength of light for illumination of the mask, wherein the width of the aperture is larger than the wavelength of the light for the illumination of the mask, wherein the detection unit includes a two-dimensional a photodetector array, and the light transmitted through the aperture and the light transmitted through the slit are detected by the same two-dimensional photodetector array, wherein a first photodetection portion as the photodetector detects the light transmitted through the slit, and wherein a second photodetection portion, which is different from the first photodetection portion, detects the light transmitted through the aperture.

8. A device manufacturing method utilizing an exposure apparatus configured to expose a substrate to light, the apparatus including, an illumination optical system configured to illuminate a mask with light from a light source;

a projection optical system configured to project an image of a pattern of the mask on the substrate; and an image measurement device configured to measure the image of the pattern of the mask projected with the projection optical system, the device including, a detection unit configured to detect light transmitted through an aperture while the substrate is arranged at an image plane of the projection optical system, the substrate having a slit and the aperture;

a signal processing unit configured to process a signal related to the light detected by the detection unit; and an alignment unit configured to adjust an alignment angle of the slit on the basis of the signal processed with the signal processing unit, wherein the image is measured by detecting light transmitted through the slit while moving the slit, the alignment angle of which has been adjusted by the alignment unit, in the image plane of the projection optical system, wherein the width of the slit is smaller than a wavelength of light for illumination of the mask, wherein the width of the aperture is larger than the wavelength of the light for the illumination of the mask, wherein the detection unit includes a two-dimensional a photodetector array, and the light transmitted through the aperture and the light transmitted through the slit are detected by the same two-dimensional photodetector array, wherein a first photodetection portion as the photodetector detects the light transmitted through the slit, and wherein a second photodetection portion, which is different from the first photodetection portion, detects the light transmitted through the aperture;

the method comprising:

exposing the substrate to light by using the exposure apparatus; and developing the exposed substrate.

9. The image measurement method according to claim 1, further comprising:

obtaining a position of the aperture by detecting the light transmitted through the aperture;

obtaining an inclination of the slit from the position of the aperture;

adjusting the slit based on the obtained inclination; and measuring the light intensity of the light transmitted through the slit by scanning the slit.

10. The image measurement method according to claim 1, wherein two apertures are formed on the substrate on which the slit is formed.

11. The image measurement method according to claim 10, wherein the two apertures are arranged such that a direction connecting centers of the two apertures is parallel to a longitudinal direction of the slit, and wherein the lights transmitted through the two apertures are detected at two positions on the photodetector array according to a direction in which a plane wave for forming the image advances, and the position of the slit is adjusted such that a quadrangle to be formed by connecting four positions at which the lights transmitted through the two apertures are detected on the photodetector array becomes a rectangle.

* * * * *